(12) United States Patent
Dhanasekaran

(10) Patent No.: US 7,872,531 B1
(45) Date of Patent: Jan. 18, 2011

(54) AMPLIFIER BIAS TECHNIQUES

(75) Inventor: Vijayakumar Dhanasekaran, San Diego, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 0 days.

(21) Appl. No.: 12/580,979

(22) Filed: Oct. 16, 2009

(51) Int. Cl.
*H03F 3/26* (2006.01)

(52) U.S. Cl. ...................... 330/267; 330/261

(58) Field of Classification Search ............... 330/267, 330/261, 253, 258
See application file for complete search history.

(56) References Cited

U.S. PATENT DOCUMENTS 6,828,856 B2 * 12/2004 Sanchez et al. ............ 330/253
7,042,290 B2 * 5/2006 Zhang et al. ............... 330/255
7,342,450 B2 * 3/2008 Jones ........................ 330/253
7,733,181 B2 * 6/2010 Jaeger et al. ............... 330/261

* cited by examiner

*Primary Examiner*—Henry K Choe
(74) *Attorney, Agent, or Firm*—Ramin Mobarhan

(57) ABSTRACT

Techniques for generating a bias voltage for a class AB amplifier having first and second active transistors. In an exemplary embodiment, a diode-coupled first transistor supports a first current, and the gate voltage of the first transistor is coupled to the gate voltage of the first active transistor. The first current is split into a second current and a first auxiliary current supported by a second transistor, which is biased at a desired common-mode output voltage of the class AB amplifier. The first auxiliary current is further combined with a third current to be supported by a third transistor, with the third transistor configured to replicate the characteristic of the second active transistor. Further techniques are provided for setting the drain voltage of the third transistor to be close to the common-mode output voltage. The techniques described herein may be used to provide a bias voltage for the NMOS and/or PMOS active transistors in a class AB amplifier.

22 Claims, 8 Drawing Sheets

AMPLIFIER BIAS TECHNIQUES

BACKGROUND

1. Field

The disclosure relates to electronic circuit design, and in particular, to the design of biasing circuits for class AB amplifiers.

2. Background

In the art of electronic amplifier design, class AB amplifiers are commonly used to deliver large currents to a load, with low distortion. A class AB amplifier stage is biased such that the current consumption in the absence of an input signal (i.e., the "quiescent" current) is a small fraction of the peak current that is delivered to the load. For instance, in a typical class AB amplifier for audio applications, the quiescent current may be as low as 0.2% of the peak current. The quiescent current is an important parameter since it affects the overall power consumption of a device incorporating the amplifier.

While a class AB amplifier may be biased to have low quiescent current under nominal conditions, the quiescent current may vary greatly when parameters like process, temperature, or the supply voltage deviate from their nominal values. It would be desirable to provide a biasing scheme for class AB amplifiers that is robust to changes in the above-mentioned parameters, thereby maintaining good power efficiency and linearity for the amplifier across a wide range of operating conditions.

DETAILED DESCRIPTION

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The detailed description set forth below in connection with the appended drawings is intended as a description of exemplary aspects of the invention and is not intended to represent the only exemplary aspects in which the invention can be practiced. The term "exemplary" used throughout this description means "serving as an example, instance, or illustration," and should not necessarily be construed as preferred or advantageous over other exemplary aspects. The detailed description includes specific details for the purpose of providing a thorough understanding of the exemplary aspects of the invention. It will be apparent to those skilled in the art that the exemplary aspects of the invention may be practiced without these specific details. In some instances, well known structures and devices are shown in block diagram form in order to avoid obscuring the novelty of the exemplary aspects presented herein.

Figure 1:
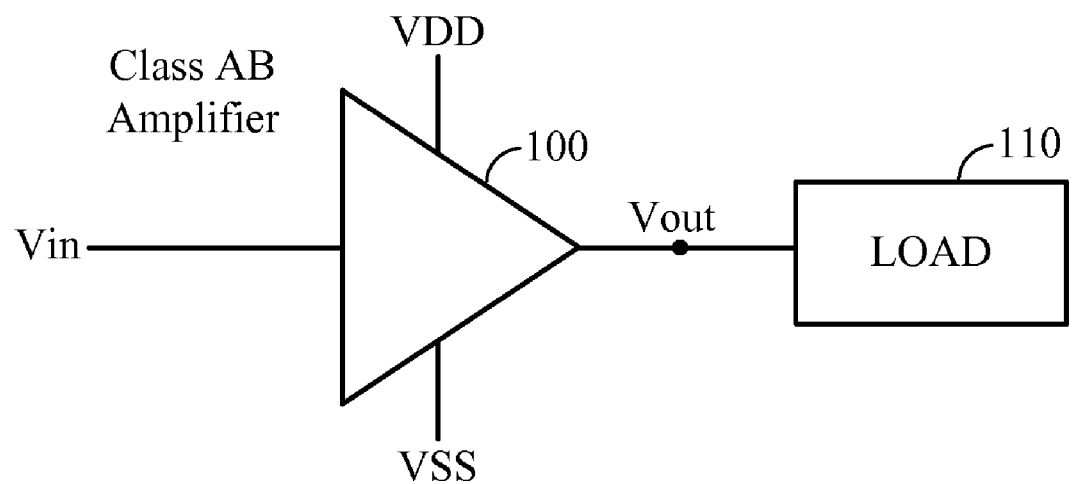
FIG. 1 illustrates an exemplary embodiment of a system employing a class AB amplifier.

FIG. 1 illustrates an exemplary embodiment of a system employing a class AB amplifier 100. The amplifier 100 is a voltage amplifier, and amplifies an input voltage Vin to generate an output voltage Vout. Vout may be used to drive a load 110. The amplifier 100 is coupled to a positive supply voltage VDD and a negative supply voltage VSS. It will be appreciated that a class AB amplifier may be used to drive a variety of loads, including, e.g., computer and other electronic components, audio loads, radio-frequency loads such as antennas, twisted-pair wire transmission media, etc. One of ordinary skill in the art will appreciate that the techniques disclosed herein are readily applicable to class AB amplifiers driving any types of loads. Furthermore, a class AB amplifier may be used in a wide variety of applications, e.g., as the output stage of an operational amplifier (op-amp). Such exemplary embodiments are contemplated to be within the scope of the present disclosure.

One of ordinary skill in the art will appreciate that a class AB amplifier combines the low-distortion characteristics of a class A amplifier with the high-efficiency characteristics of a class B amplifier. In particular, the active transistors in a class AB amplifier may be biased so that one transistor conducts current over half of a sinusoidal cycle, while another transistor conducts current over the other half of the cycle, and both transistors remain on for a period of time during the transitions between the two halves of the cycle.

Figure 2:
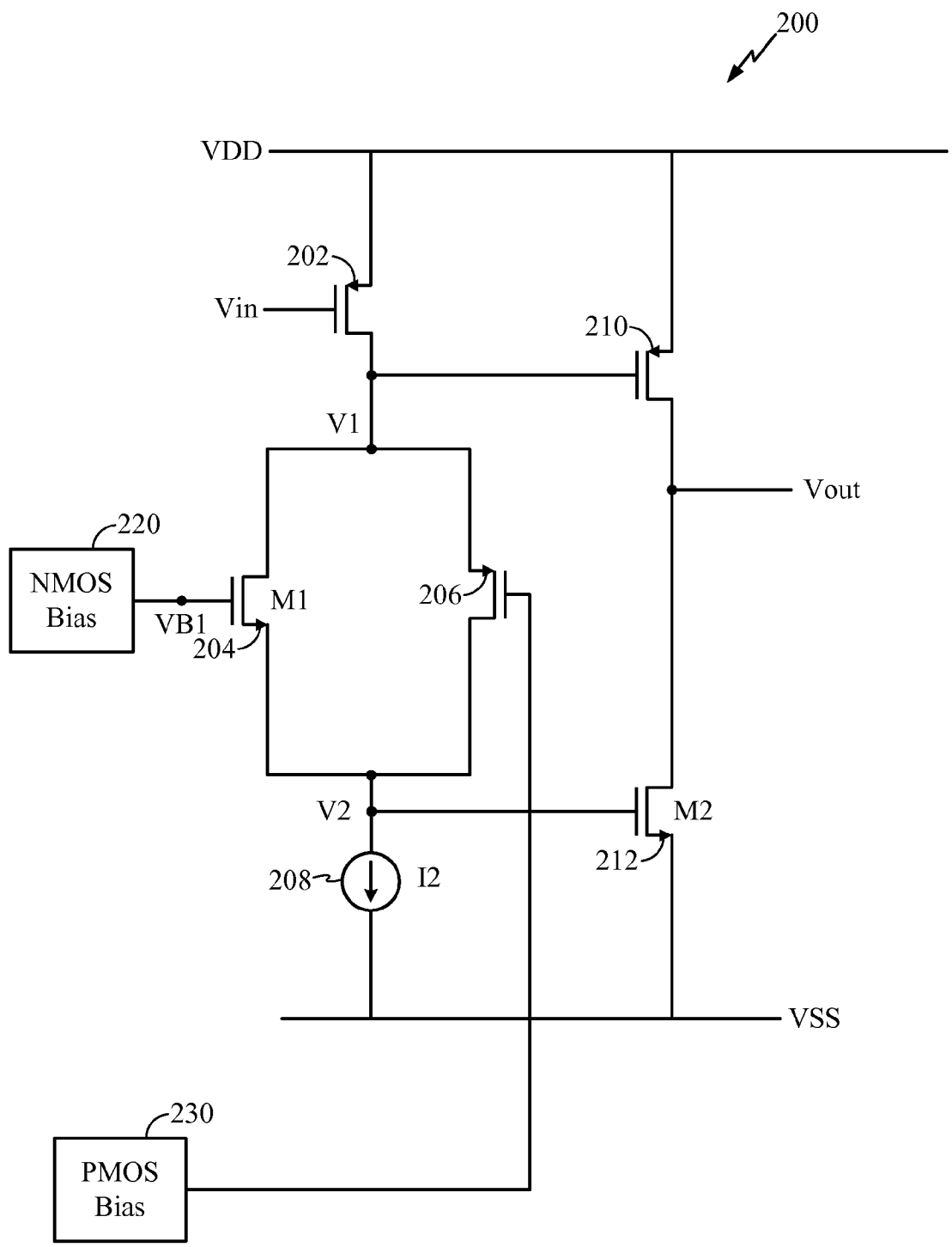
FIG. 2 illustrates an exemplary embodiment of a class AB amplifier.

FIG. 2 illustrates an exemplary embodiment 200 of a class AB amplifier. In FIG. 2, a PMOS transistor 202 is configured as a common-source amplifier to accept at its gate the input voltage Vin of the class AB amplifier. A current proportional to Vin is generated at the drain of transistor 202 via the transconductance of transistor 202, and the drain current is coupled to the source of PMOS transistor 206 and the drain of NMOS transistor 204. In FIG. 2, NMOS transistor 204 has a width-over-length (W/L) ratio of M1.

Transistors 204 and 206 are coupled to generate voltages V1 and V2 proportional to Vin. V1 and V2 are subsequently provided to transistors 210 and 212, respectively, which form a push-pull pair for generating the output voltage Vout. Transistor 212 has a W/L ratio of M2. Transistor 204 is biased by a voltage VB1 generated by NMOS bias generator 220, while transistor 206 is biased by a voltage (not labeled in FIG. 2) generated by PMOS bias generator 230.

Note in this specification and in the claims, either of the transistors 204 of 206 may be denoted a "first active transistor," while either of the transistors 210 or 212 may be denoted a "second active transistor."

In an alternative exemplary embodiment, transistors 202, 210, and/or 212, and/or the transistor forming the current source 208 may also be provided with additional cascode transistors, and such a configuration may be readily accommodated by one of ordinary skill in the art by modifying the techniques disclosed herein. Such alternative exemplary embodiments fall within the scope of the present disclosure.

Figure 2A:
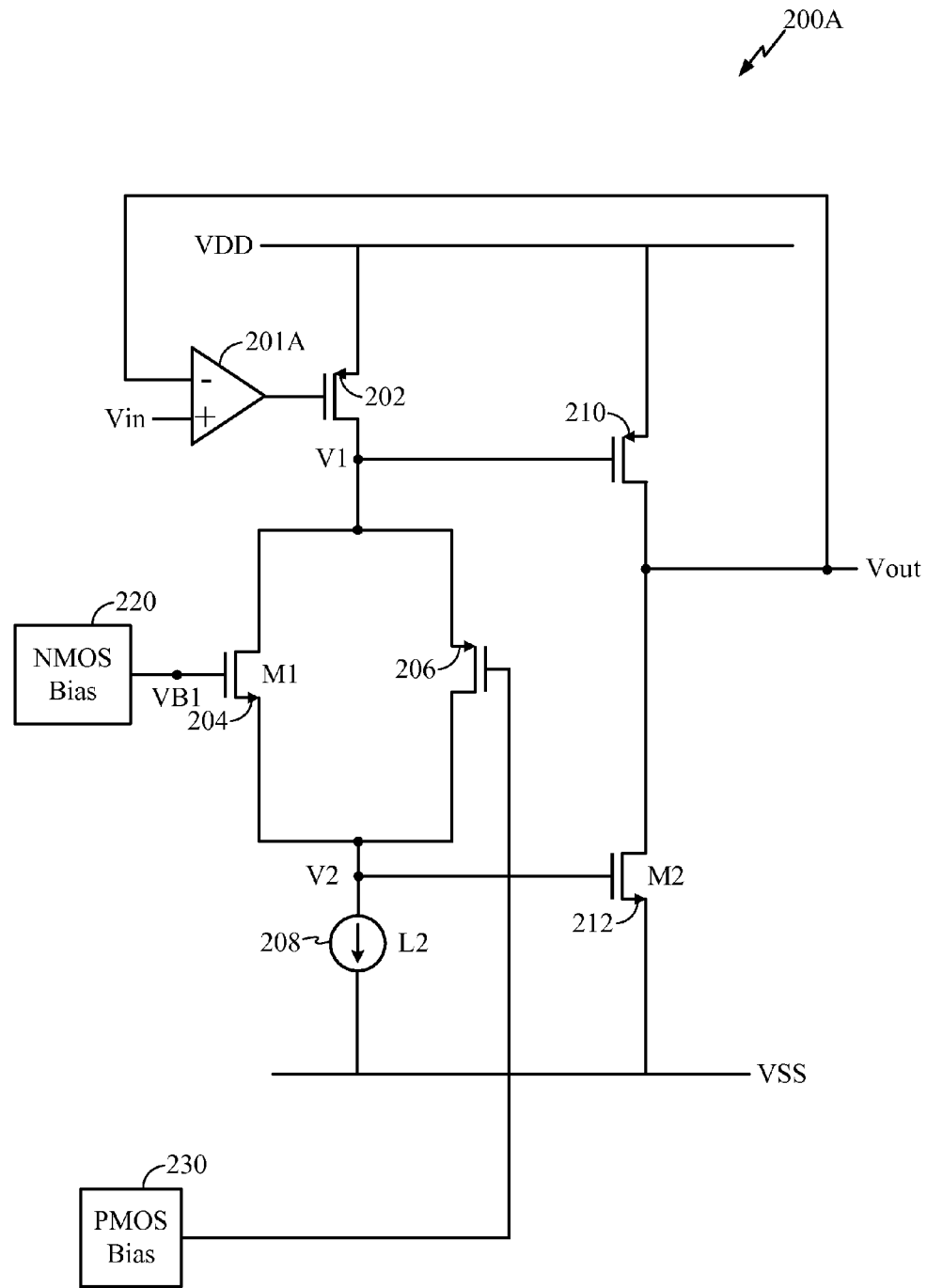
FIG. 2A illustrates an alternative exemplary embodiment of a class AB amplifier.

FIG. 2A illustrates an alternative exemplary embodiment 200A of a class AB amplifier. Note similarly labeled elements in FIGS. 2 and 2A have similar functionality, unless otherwise noted. In FIG. 2A, a buffer amplifier 201A is provided to buffer the input voltage Vin prior to providing to the gate of transistor 202. Through negative feedback, the output voltage Vout of the amplifier 200A will track the input voltage Vin within the combined bandwidth of the buffer amplifier 201A and the class AB-amplifier 200.

It will be appreciated that in both the exemplary embodiments 200 and 200A, the biasing of transistors 204 and 206 significantly affects the quiescent current and linearity of the class AB amplifier. In particular, variations in the bias voltages over process, supply voltage, and temperature may significantly vary the quiescent current, thereby reducing the efficiency or linearity of the class AB amplifier.

Figure 3:
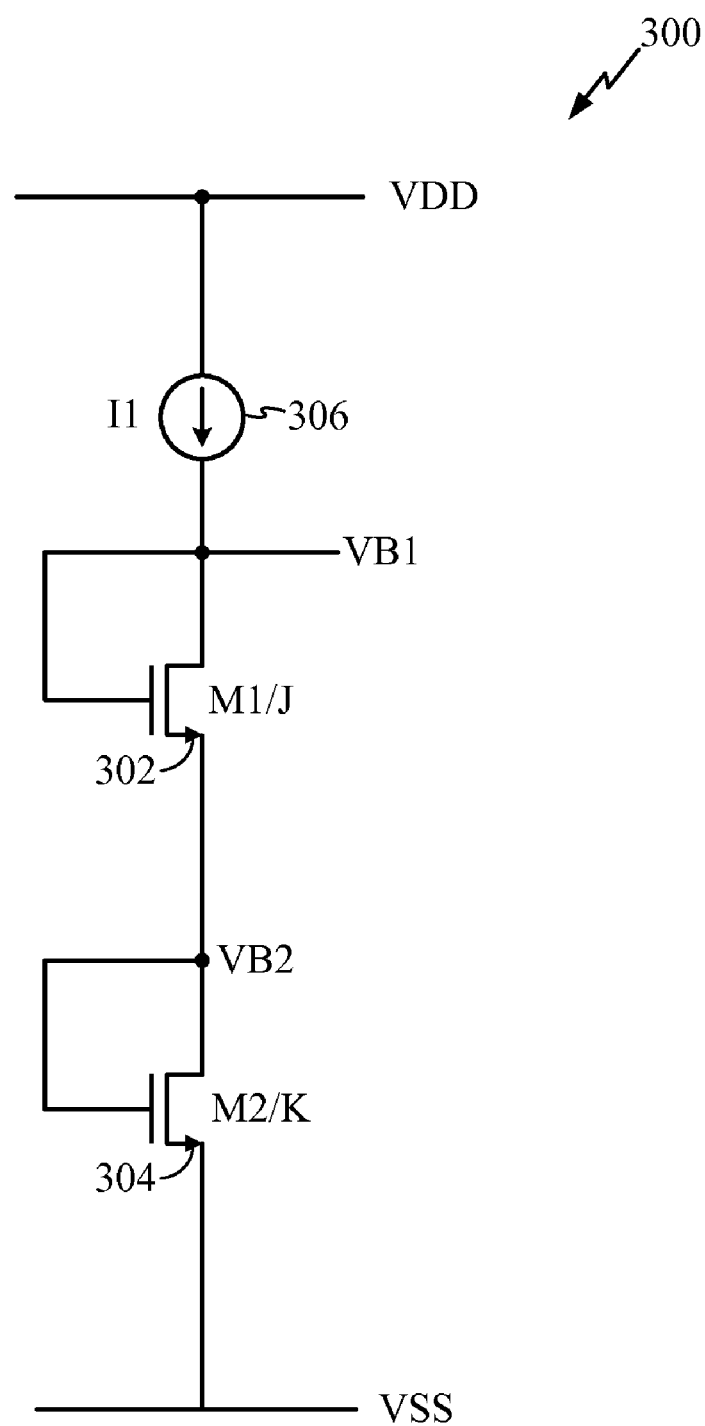
FIG. 3 illustrates a prior art implementation of an NMOS bias generator.

FIG. 3 illustrates a prior art implementation 300 of an NMOS bias generator 220.

In FIG. 3, a current source 306 is configured to generate a predetermined current I1. The current I1 passes through (or is supported by) transistors 302 and 304 in series. Transistor 302 has a W/L ratio that is J times less than the W/L ratio M1 of the first active transistor 204 in FIG. 2, and is designed to otherwise replicate the characteristics of transistor 204. Transistor 304 has a W/L ratio that is K times less than the W/L ratio M2 of the second active transistor 212 in FIG. 2, and is designed to otherwise replicate the characteristics of transistor 212.

Both transistors 302 and 304 are diode-connected to generate appropriate gate-to-source voltages VGS to support the current I1. In the implementation shown, the gate voltage of transistor 302 is provided as the bias voltage VB1 to the gate of transistor 204, to generate a current of approximately J*I1 in transistor 204. Due to the gate-to-source voltage drop across transistor 204, the gate voltage V2 of transistor 212 will then correspond approximately to VB2, i.e., the gate voltage of transistor 304, to generate a current of approximately K*I1 in transistor 212.

It will be appreciated that one limitation of the prior art NMOS bias generator 300 is that it does not accurately account for the drain-to-source voltage (VDS) of the transistor 212, since the bias transistor 304 of the bias generator 300 is diode-coupled, while transistor 212 is not. It will be appreciated that the VDS of transistor 212 may significantly affect the current supported by transistor 212, as the transistor 212 may generally be designed with short length for class AB amplifier applications, and thus its bias current may be especially susceptible to variations in VDS.

Figure 4:
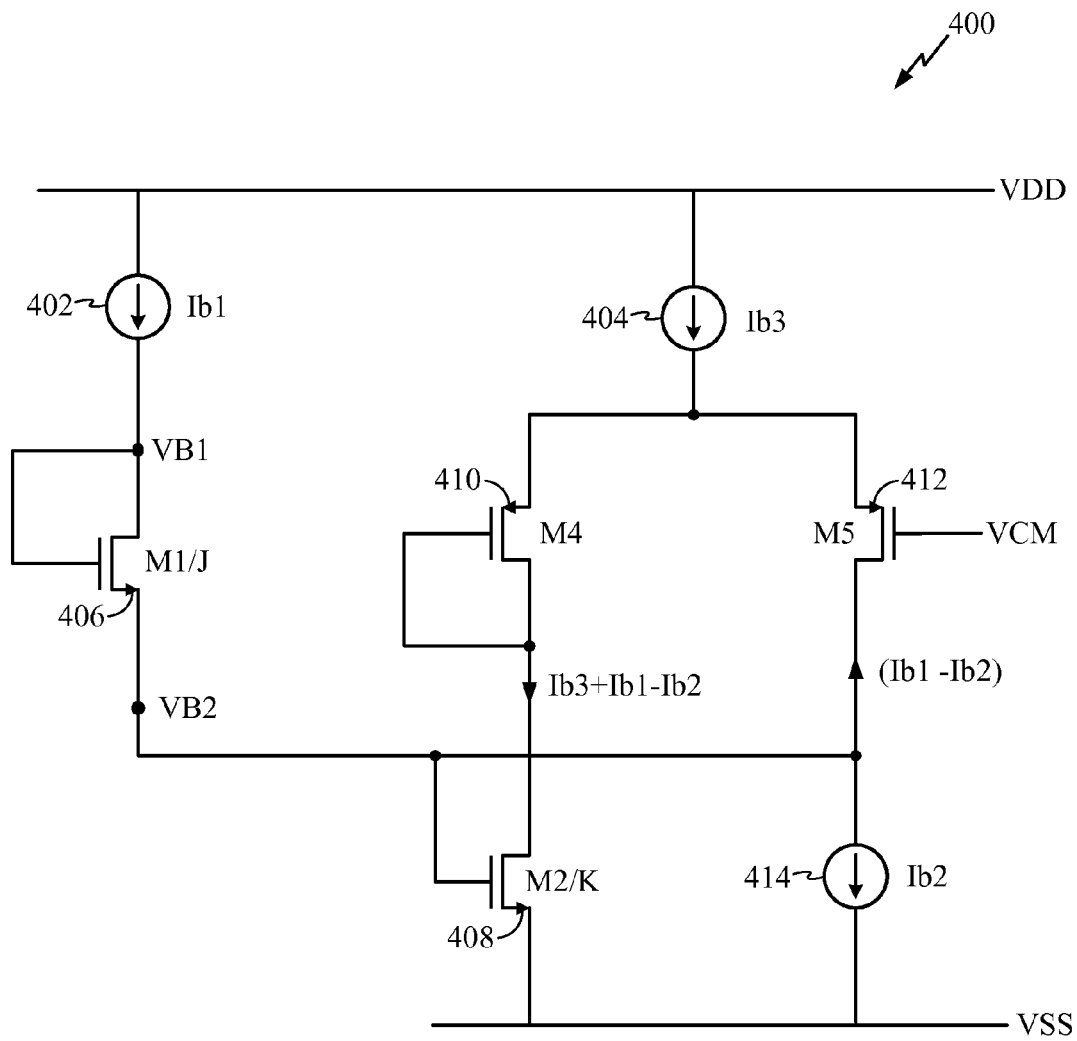
FIG. 4 illustrates an exemplary embodiment of an NMOS bias generator according to the present disclosure.

FIG. 4 illustrates an exemplary embodiment 400 of an NMOS bias generator 220 according to the present disclosure. In FIG. 4, a current source 402 is configured to generate a predetermined current Ib1 (also denoted herein as a "first current"). The current Ib1 is supported by a diode-coupled transistor 406 (also denoted herein as a "first transistor"). The transistor 406 may have a W/L ratio that is J times less than the W/L ratio M1 of the first active transistor 204 in FIG. 2, and may be designed to otherwise replicate the characteristics of the first active transistor 204. The gate voltage of transistor 406 may be provided as the bias voltage VB1 to the gate of the first active transistor 204, to generate a current of approximately J*Ib1 in transistor 204.

In FIG. 4, the source voltage VB2 of transistor 406 is coupled to the gate of transistor 408 (also denoted herein as a "third transistor"). The transistor 408 may have a W/L ratio that is K times less than the W/L ratio M2 of the second active transistor 212 in FIG. 2, and may be designed to otherwise replicate the characteristics of transistor 212. The drain of transistor 408 is coupled to the drain of diode-coupled PMOS transistor 410 (also denoted herein as a "fourth transistor"). In the exemplary embodiment shown in FIG. 4, transistor 410 is one transistor of a transistor pair that also includes a PMOS transistor 412 (also denoted herein as a "second transistor"), whose gate is biased with a desired common-mode voltage VCM for the class AB amplifier output. In an exemplary embodiment, VCM may be chosen to equal ½*(VDD−VSS), i.e., one-half the difference between the voltage supply rails.

Transistors 410 and 412 are sourced by a tail current source 404 generating a predetermined current Ib3 (also denoted herein as a "third current"). The drain of transistor 412 is further coupled to a current source 414 configured to generate a predetermined current Ib2 (also denoted herein as a "second current"). The drain of transistor 412 is also coupled to the voltage VB2. The operation of the NMOS bias generator 400 is further described in detail hereinbelow.

From FIG. 4, it will be appreciated that the current supported by transistor 412 (also denoted herein as the "first auxiliary current") may be expressed as (Ib1−Ib2), while the current supported by transistors 410 and 408 (also denoted herein as the "second auxiliary current") may be correspondingly expressed as (Ib3+Ib1−Ib2). Due to these considerations, the voltage VB2 will take on a value necessary for transistor 408 to generate the current (Ib3+Ib1−Ib2). Furthermore, assuming transistors 410 and 412 have the same current density, the gate (and drain) voltage of transistor 410 will be approximately VCM, and thus the drain voltage of transistor 408 will also be set at approximately VCM. As VCM is expected to equal the drain voltage of the active transistor 212 in FIG. 2 in the quiescent condition, the drain-to-source voltage across transistor 408 is expected to advantageously replicate the quiescent drain-to-source voltage across transistor 212.

In an exemplary embodiment, the bias current Ib1 in FIG. 4 may be chosen to be J times less than the desired quiescent current through the active transistor 204. Furthermore, Ib3 and Ib2 may be chosen such that (Ib3+Ib1−Ib2) is K times less than the desired quiescent current through the second active transistor 212. In an exemplary embodiment, Ib3 and Ib2 are chosen such that the current density of 410 and 412 are equal.

Figure 5:
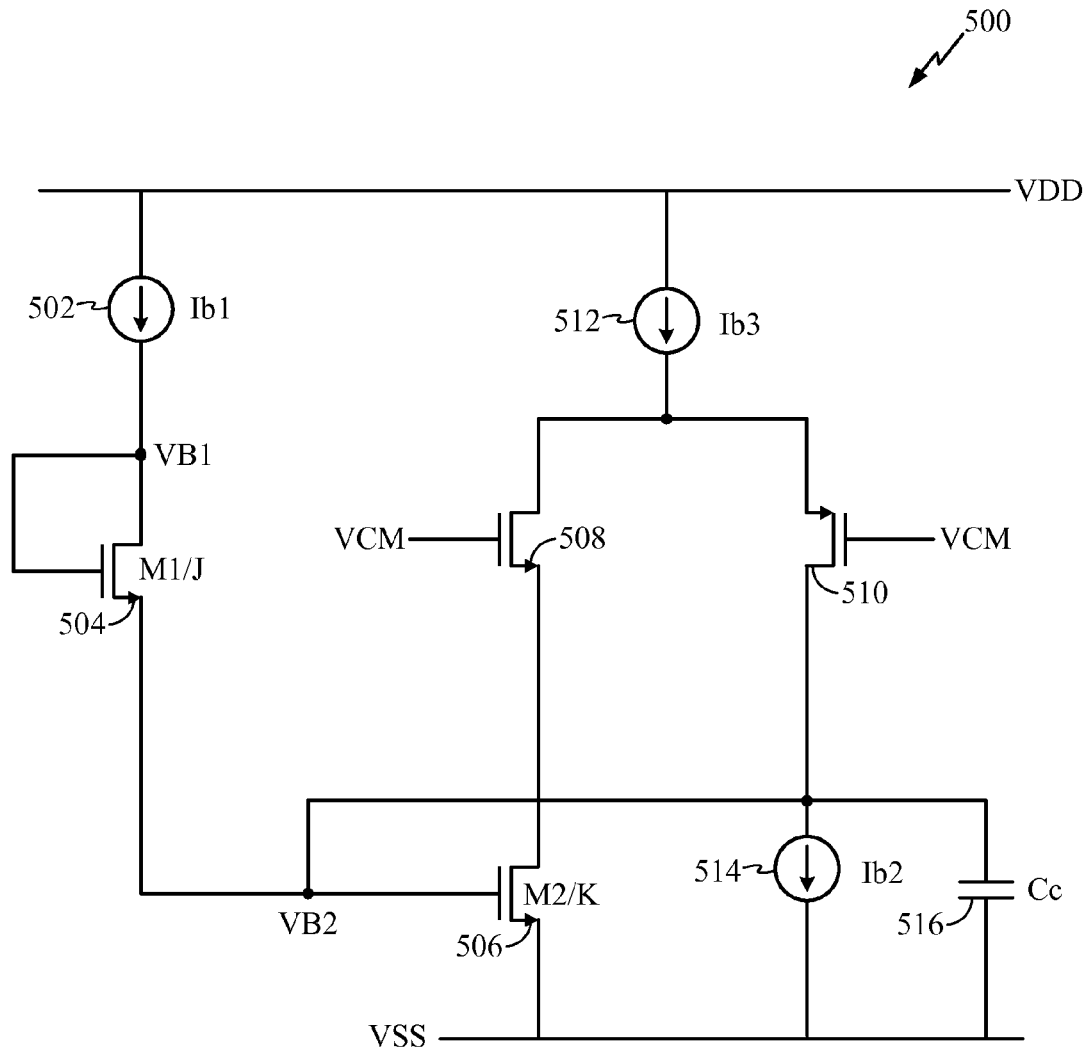
FIG. 5 illustrates an alternative exemplary embodiment of an NMOS bias generator according to the present disclosure.

FIG. 5 illustrates an alternative exemplary embodiment 500 of an NMOS bias generator 220 according to the present disclosure. In FIG. 5, a native threshold NMOS transistor 508 (i.e., a transistor having threshold voltage Vt close to zero) is provided with a gate bias voltage of VCM. The transistor 508 sets the drain voltage of transistor 506 close to VCM (e.g., to within a gate overdrive voltage of the native threshold NMOS transistor). Due to the operation of the rest of the circuitry as described above, a voltage VB2 at the gate of transistor 506 required to support the current (Ib3+Ib1−Ib2) is generated. Note a compensation capacitor 516 (also denoted as Cc) may be provided to ensure stability of the feedback loop formed by transistors 506, 508, and 510.

Figure 6:
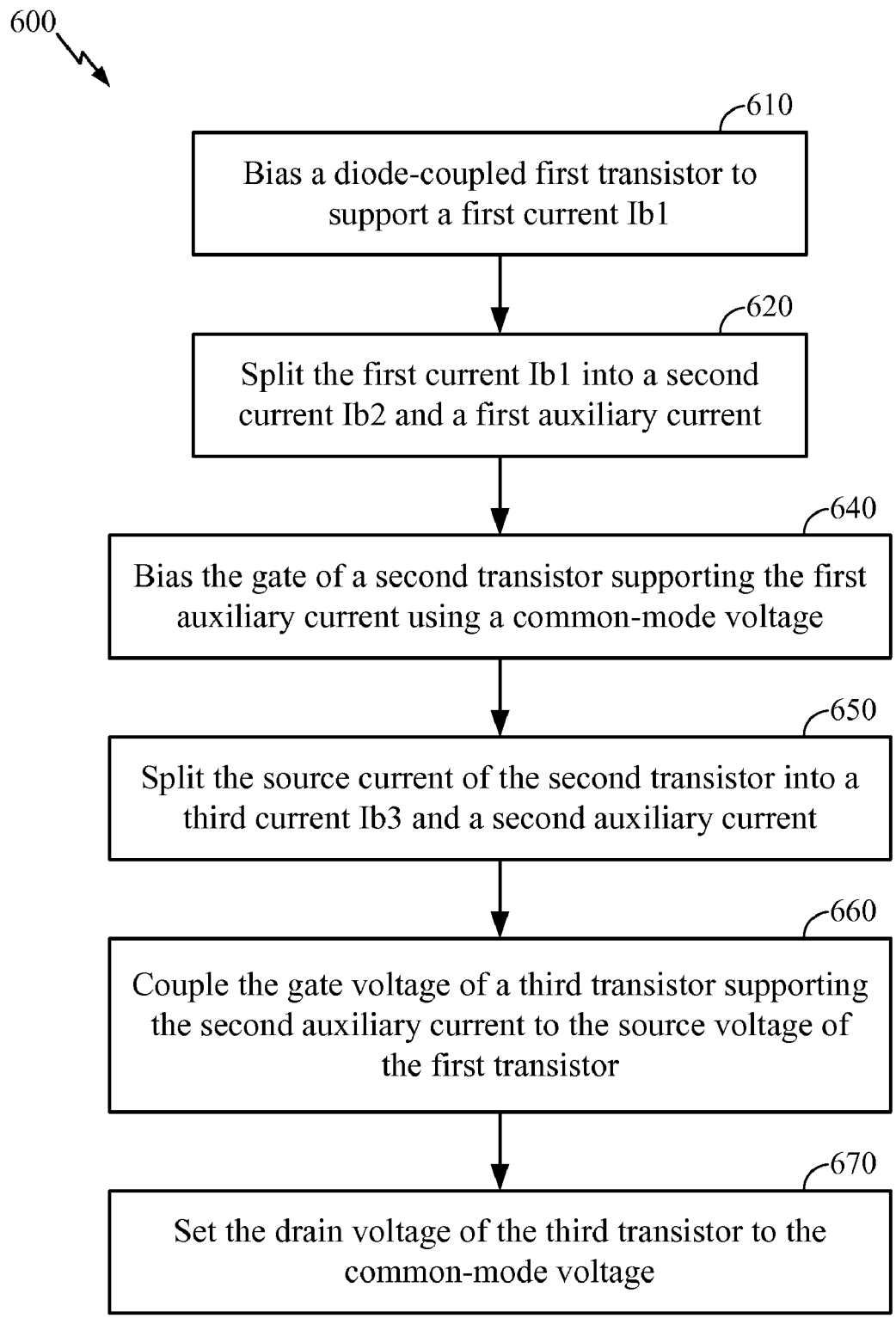
FIG. 6 illustrates an exemplary embodiment of a method according to the present disclosure.

FIG. 6 illustrates an exemplary embodiment 600 of a method according to the present disclosure. Note the method 600 is shown for illustrative purposes only, and is not meant to limit the scope of the present disclosure.

In FIG. 6, at block 610, a diode-coupled first transistor is biased to support a first current Ib1.

At block 620, the first current Ib1 is split into a second current Ib2 and a first auxiliary current.

At block 640, the gate of a second transistor supporting the first auxiliary current is biased using a common-mode voltage.

At block 650, the source current of the second transistor is split into a third current Ib3 and a second auxiliary current.

At block 660, the gate voltage of a third transistor supporting the second auxiliary current is coupled to the source voltage of the first transistor.

At block 670, the drain voltage of the third transistor is set to the common-mode voltage.

Figure 7:
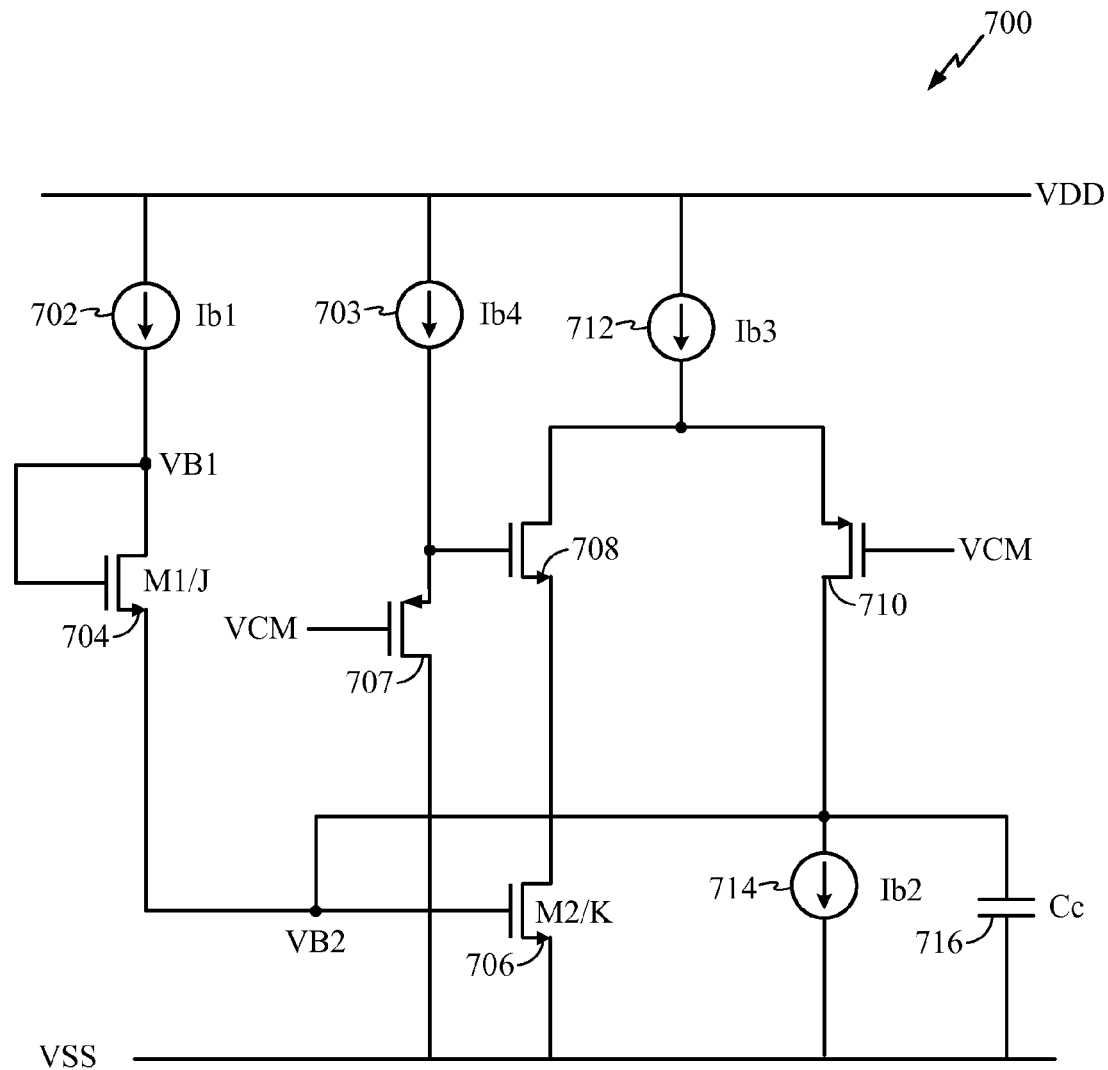
FIG. 7 illustrates an alternative exemplary embodiment of an NMOS bias generator according to the present disclosure.

FIG. 7 illustrates an alternative exemplary embodiment 700 of an NMOS bias generator 220 according to the present disclosure. In FIG. 7, a PMOS transistor 707 is provided with a gate bias voltage of VCM. A current source 703 configured to generate a current Ib4 is coupled to the source of transistor 707. The source voltage of transistor 707 is coupled to the gate of an NMOS transistor 708. In an exemplary embodiment, the current Ib4 and the W/L ratio of transistor 707 are chosen such that the VGS of transistor 707 roughly equals the VGS of transistor 708. As the source of transistor 707 is coupled to the gate of transistor 708, the source of transistor 708 is expected to be roughly equal VCM, thus setting the drain voltage of transistor 706 at VCM.

One of ordinary skill in the art will appreciate that while exemplary embodiments 400, 500, and 700 of an NMOS bias generator 220 have been described herein, the same techniques may be readily applied to design a PMOS bias generator 230. For example, alternative exemplary embodiments may readily employ PMOS devices in place of NMOS devices in the bias circuitry 400, 500, and 700 shown, and vice versa. Such alternative exemplary embodiments are contemplated to be within the scope of the present disclosure.

One of ordinary skill in the art will appreciate that while exemplary embodiments of the present disclosure have been described with reference to MOS transistors (MOSFET's), the techniques of the present disclosure need not be limited to MOSFET-based designs, and may be readily applied to alternative exemplary embodiments (not shown) employing bipolar junction transistors (or BJT's) and/or other three-terminal transconductance devices. For example, in an exemplary embodiment (not shown), any of the comparators shown may utilize BJT's rather than MOSFET's, with the collectors, bases, and emitters of the BJT's coupled as shown for the drains, gates, and sources, respectively, of the MOSFET's. Alternatively, in BiCMOS processes, a combination of both CMOS and bipolar structures/devices may be employed to maximize the circuit performance. Furthermore, unless otherwise noted, in this specification and in the claims, the terms "drain," "gate," and "source" may encompass both the conventional meanings of those terms associated with MOSFET's, as well as the corresponding nodes of other three-terminal transconductance devices, such as BJT's, which correspondence will be evident to one of ordinary skill in the art of circuit design.

In this specification and in the claims, it will be understood that when an element is referred to as being "connected to" or "coupled to" another element, it can be directly connected or coupled to the other element or intervening elements may be present. In contrast, when an element is referred to as being "directly connected to" or "directly coupled to" another element, there are no intervening elements present.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill in the art would further appreciate that the various illustrative logical blocks, modules, circuits, and algorithm steps described in connection with the exemplary aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary aspects of the invention.

The various illustrative logical blocks, modules, and circuits described in connection with the exemplary aspects disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the exemplary aspects disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary aspects, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-Ray disc where disks usually reproduce data magnetically, while discs reproduce data optically with lasers. Combinations of the above should also be included within the scope of computer-readable media.

The previous description of the disclosed exemplary aspects is provided to enable any person skilled in the art to make or use the invention. Various modifications to these exemplary aspects will be readily apparent to those skilled in the art, and the generic principles defined herein may be applied to other exemplary aspects without departing from the spirit or scope of the invention. Thus, the present disclosure is not intended to be limited to the exemplary aspects shown herein but is to be accorded the widest scope consistent with the principles and novel features disclosed herein.

The invention claimed is:

1. An apparatus comprising:
   a diode-coupled first transistor supporting a first current Ib1, the first current Ib1 further split into a second current Ib2 and a first auxiliary current;
   a second transistor supporting the first auxiliary current, the gate of the second transistor biased by a common-mode voltage, the source current of the second transistor further split into a third current Ib3 and a second auxiliary current; and
   a third transistor supporting the second auxiliary current, the gate of the third transistor coupled to the source of the first transistor, the drain voltage of the third transistor set to the common-mode voltage.

2. The apparatus of claim 1, further comprising a class AB amplifier comprising first and second active transistors, the gate of the first transistor coupled to the gate of the first active transistor to bias the class AB amplifier.

3. The apparatus of claim 2, the first and second active transistors of the class AB amplifier and the first and third transistors comprising NMOS transistors, the second transistor comprising a PMOS transistor.

4. The apparatus of claim 2, the first and second active transistors of the class AB amplifier and the first and third transistors comprising PMOS transistors, the second transistor comprising an NMOS transistor.

5. The apparatus of claim 2, the first active transistor and the first transistor configured to have the same length, the first active transistor configured to be wider than the first transistor, a second active transistor of the class AB amplifier and the third transistor configured to have the same length, the second active transistor configured to be wider than the third transistor.

6. The apparatus of claim 1, further comprising a diode-coupled fourth transistor coupling the source of the second transistor to the drain of the third transistor to set the drain voltage of the third transistor, the fourth transistor having the same current density as the second transistor.

7. The apparatus of claim 1, further comprising a native threshold transistor coupling the source of the second transistor to the drain of the third transistor, the gate of the native threshold transistor being biased to the common-mode voltage to set the drain voltage of the third transistor.

8. The apparatus of claim 7, further comprising a compensation capacitor coupled to the gate of the third transistor.

9. The apparatus of claim 1, further comprising a fourth transistor and a fifth transistor, the fourth transistor coupling the source of the second transistor to the drain of the third transistor, the fifth transistor supporting a current Ib4, the gate of the fourth transistor coupled to the source of the fifth transistor, the gate of the fifth transistor being biased to the common-mode voltage to set the source voltage of the fourth transistor at the common-mode voltage.

10. The apparatus of claim 1, the apparatus comprising an audio amplifier.

11. The apparatus of claim 1, the apparatus comprising an operational amplifier.

12. A method comprising:
    biasing a diode-coupled first transistor to support a first current Ib1;
    splitting the first current Ib1 into a second current Ib2 and a first auxiliary current;
    biasing the gate of a second transistor supporting the first auxiliary current using a common-mode voltage;
    splitting the source current of the second transistor into a third current Ib3 and a second auxiliary current;
    coupling the gate voltage of a third transistor supporting the second auxiliary current to the source voltage of the first transistor; and
    setting the drain voltage of the third transistor to the common-mode voltage.

13. The method of claim 12, further comprising coupling the gate voltage of the first transistor to the gate voltage of a first active transistor of a class AB amplifier.

14. The method of claim 13, the class AB amplifier comprising first and second active transistors, the first and second active transistors and the first and third transistors comprising NMOS transistors, the second transistor comprising a PMOS transistor.

15. The method of claim 13, the class AB amplifier comprising first and second active transistors, the first and second active transistors and the first and third transistors comprising PMOS transistors, the second transistor comprising an NMOS transistor.

16. The method of claim 13, the first active transistor and the first transistor configured to have the same length, the first active transistor configured to be wider than the first transistor, a second active transistor of the class AB amplifier and the third transistor configured to have the same length, the second active transistor configured to be wider than the third transistor.

17. The method of claim 12, the setting the drain voltage of the third transistor comprising:
    coupling the source voltage of a diode-coupled fourth transistor to the source of the second transistor, the fourth transistor being matched to the second transistor; and
    coupling the drain voltage of the third transistor to the drain voltage of the fourth transistor.

18. The method of claim 12, the setting the drain voltage of the third transistor comprising:
    coupling the drain voltage of a native threshold fourth transistor to the source of the second transistor;
    biasing the gate of the fourth transistor the common-mode voltage; and
    coupling the source voltage of the fourth transistor to the drain voltage of the third transistor.

19. The method of claim 18, further comprising coupling a compensation capacitance to the gate voltage of the third transistor.

20. The method of claim 12, further comprising:
coupling the source voltage of the second transistor to a drain of a fourth transistor;
coupling the source voltage of the fourth transistor to the drain of the third transistor;
coupling the gate voltage of the fourth transistor to the source voltage of a fifth transistor, the fifth transistor supporting a current Ib4; and
biasing the gate voltage of the fifth transistor to the common-mode voltage to set the source voltage of the fourth transistor at the common-mode voltage.

21. An apparatus comprising:
means for generating a first bias voltage for a first transistor supporting a fraction of the desired bias current for a first active transistor of a class AB amplifier, the first bias voltage provided to bias the first active transistor;
means for generating a second bias voltage for a third transistor supporting a fraction of the desired bias current for a second active transistor of the class AB amplifier; and
means for setting a drain voltage for the third transistor replicating a quiescent operation drain voltage for the second active transistor.

22. The apparatus of claim 21, the means for setting the drain voltage for the third transistor comprising a source-coupled pair comprising fourth and second transistors having equal current density, the fourth transistor being diode-coupled, the drain of the fourth transistor being coupled to the drain of the third transistor, the second transistor being biased by a common-mode voltage.

* * * * *